United States Patent
Park et al.

(10) Patent No.: US 10,084,031 B2
(45) Date of Patent: Sep. 25, 2018

(54) TRANSISTOR SUBSTRATE, DISPLAY DEVICE, AND METHOD OF MANUFACTURING THE TRANSISTOR SUBSTRATE

(71) Applicant: Samsung Display Co., Ltd., Yongin-si, Gyeonggi-do (KR)

(72) Inventors: Jae Hyun Park, Yongin-si (KR); Sang Kyung Lee, Yongin-si (KR); Jong Moo Huh, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/630,697

(22) Filed: Jun. 22, 2017

(65) Prior Publication Data

US 2018/0097053 A1    Apr. 5, 2018

(30) Foreign Application Priority Data

Sep. 30, 2016   (KR) ................. 10-2016-0126170

(51) Int. Cl.
*H01L 27/32* (2006.01)
*H01L 51/56* (2006.01)
*H01L 51/52* (2006.01)
*H01L 27/12* (2006.01)
(Continued)

(52) U.S. Cl.
CPC ...... *H01L 27/3276* (2013.01); *H01L 27/3248* (2013.01); *H01L 27/3258* (2013.01); *H01L 27/3262* (2013.01); *H01L 51/5206* (2013.01); *H01L 51/56* (2013.01); *H01L 27/124* (2013.01); *H01L 27/1225* (2013.01); *H01L 27/1248* (2013.01); *H01L 27/1262* (2013.01); *H01L 29/66969* (2013.01); *H01L 29/7869* (2013.01); *H01L 2227/323* (2013.01); *H01L 2251/301* (2013.01); *H01L 2251/308* (2013.01); *H01L 2251/558* (2013.01)

(58) Field of Classification Search
CPC ............ H01L 27/3258; H01L 27/3262; H01L 27/3276; H01L 27/3279
See application file for complete search history.

(56) References Cited

U.S. PATENT DOCUMENTS

| 7,190,111 | B2 | 3/2007 | Lee et al. |
| 9,082,663 | B2 | 7/2015 | Isobe et al. |
| 2008/0111484 | A1 | 5/2008 | Kwon et al. |

(Continued)

FOREIGN PATENT DOCUMENTS

| KR | 10-0787461 | 12/2007 |
| KR | 10-2011-0109885 | 10/2011 |
| KR | 10-2016-0009220 | 1/2016 |

*Primary Examiner* — Daniel Shook
(74) *Attorney, Agent, or Firm* — Innovation Counsel LLP

(57) ABSTRACT

A transistor substrate may include a base substrate, a data line, a conductive layer, a semiconductor layer, a gate electrode, and a pixel electrode. The data line may directly contact the base substrate. The conductive layer may directly contact the base substrate and may be spaced from the data line. The semiconductor layer may overlap the conductive layer, may be spaced from the conductive layer, and may include a source electrode and a drain electrode. The source electrode may be electrically connected to the data line. The gate electrode may overlap the semiconductor layer. The pixel electrode may be electrically connected to the drain electrode.

20 Claims, 10 Drawing Sheets

(51) Int. Cl.
   *H01L 29/786*   (2006.01)
   *H01L 29/66*   (2006.01)

(56) References Cited

U.S. PATENT DOCUMENTS

2011/0240998 A1   10/2011   Morosawa et al.
2017/0294464 A1*  10/2017   Kwon ................ H01L 27/1288

* cited by examiner

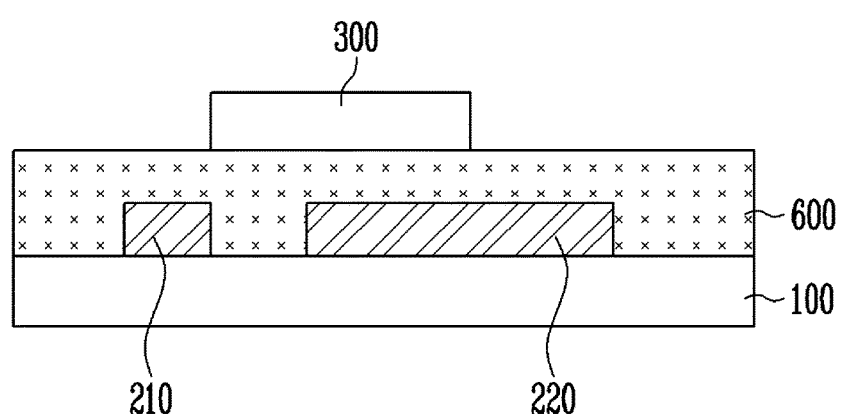

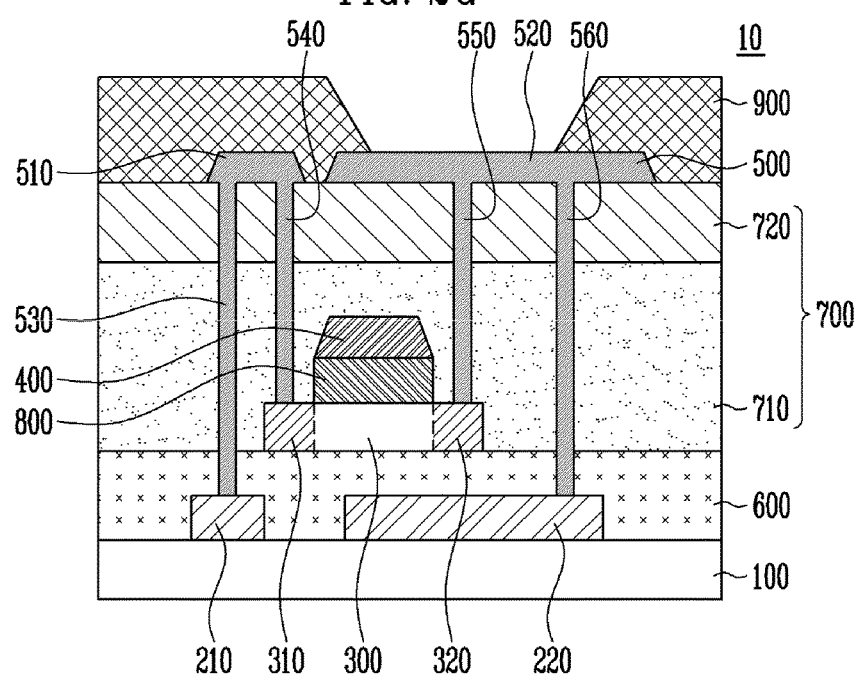

TRANSISTOR SUBSTRATE, DISPLAY DEVICE, AND METHOD OF MANUFACTURING THE TRANSISTOR SUBSTRATE

CROSS-REFERENCE TO RELATED APPLICATION

This application claims priority to and the benefit of Korean Patent Application No. 10-2016-0126170, filed on Sep. 30, 2016, in the Korean Intellectual Property Office; the entire contents of the Korean Patent Application are incorporated herein by reference in their entirety.

BACKGROUND

1. Field

The technical field relates to a transistor substrate, a display device including the transistor substrate, and a method of manufacturing the transistor substrate.

2. Description of the Related Art

A display device may include pixels arranged in a matrix. The display device may further include a transistor substrate including various elements for driving the pixels.

The transistor substrate may include gate lines for transmitting gate signals, data lines for transmitting data signals, and transistors connected to the gate lines and the data lines. Each of the transistors may include a gate electrode that extends from a corresponding gate line, a source electrode that extends from a corresponding data line, a drain electrode that faces the source electrode, and a semiconductor layer that functions as a channel.

SUMMARY

A transistor substrate according to an embodiment includes a substrate, a data line provided on the substrate, a conductive layer provided in the same layer as the data line to be spaced apart from the data line, a semiconductor layer provided on the conductive layer and having a source electrode and a drain electrode, a gate electrode provided on the semiconductor layer, and a pixel electrode connected to the drain electrode.

The transistor substrate further includes a first insulating layer provided on the data line and the conductive layer. The first insulating layer has at least one through hole that exposes parts of the conductive layer and the data line.

The transistor substrate further includes a second insulating layer provided on the gate electrode. The through hole extends from the first insulating layer to the second insulating layer and exposes a part of the conductive layer. The second insulating layer has a contact hole that exposes a part of the semiconductor layer.

The first insulating layer includes a first portion of a first through hole that exposes the data line and a first portion of a second through hole that exposes the conductive layer. The second insulating layer includes a second portion of the first through hole, a second portion of the second through hole, and a first contact hole and a second contact hole that respectively expose the source electrode and the drain electrode.

The transistor substrate further includes a first bridge provided on the second insulating layer. The first bridge electrically connects the data line and the source electrode through the first through hole and the first contact hole.

The transistor substrate further includes a second bridge provided on the second insulating layer. The second bridge is spaced from the first bridge, electrically connects the pixel electrode and the conductive layer through the second through hole, and electrically connects the drain electrode and the pixel electrode through the second contact hole.

The second insulating layer includes an organic material.

The pixel electrode includes an alloy of aluminum (Al), nickel (Ni), and lanthanum (La), an indium tin oxide (ITO) based alloy, or a TCO based alloy.

The pixel electrode includes Ni in a range of 3 to 10 parts by mass and La in a range of 1 to 7 parts by mass with respect to Al of 100 parts by mass.

The pixel electrode has a thickness in a range of 200 Å to 1,000 Å.

The transistor substrate further includes a third insulating layer provided on the pixel electrode and exposing a part of the pixel electrode.

The transistor substrate further includes a blocking layer provided on the first insulating layer, the semiconductor layer, and the gate electrode.

A portion of the first insulating layer is positioned between the data line and the conductive layer, is positioned between the source electrode and the substrate, and directly contacts each of the data line, the conductive layer, the source electrode, and the substrate.

A display device according to an embodiment includes a transistor substrate including a pixel electrode, a light emitting layer provided on the pixel electrode, and a common electrode provided on the light emitting layer. The transistor substrate includes a substrate, a data line provided on the substrate, a conductive layer provided in the same layer as the data line to be spaced apart from the data line, a semiconductor layer provided on the data line and the conductive layer and having a source electrode and a drain electrode, and a gate electrode provided on the semiconductor layer. The drain electrode is connected to the pixel electrode.

A method of manufacturing a transistor substrate according to an embodiment includes preparing a substrate, forming a data line and a conductive layer on the substrate, forming a semiconductor layer having a source electrode and a drain electrode on the data line and the conductive layer, forming a gate electrode on the semiconductor layer, and forming a pixel electrode connected to the drain electrode on the gate electrode.

The method further includes forming a first insulating layer on the data line and the conductive layer and forming a second insulating layer on the semiconductor layer and the gate electrode.

The semiconductor layer is formed by photolithography. The first insulating layer is etched in the forming of the semiconductor layer and is formed in an area in which the semiconductor layer is formed.

The method further includes forming at least one through hole in the first insulating layer and the second insulating layer and forming at least one contact hole in the second insulating layer.

The through hole is formed by forming the second insulating layer on the first insulating layer and using the second insulating layer as a mask in etching the first insulating layer.

The contact hole is formed by photolithography.

An embodiment may be related to a transistor substrate. The transistor substrate may include a base substrate, a data line, a conductive layer, a semiconductor layer, a gate electrode, and a pixel electrode. The data line may directly contact (e.g., a face of) the base substrate. The conductive layer may directly contact (e.g., the face of) the base substrate and may be spaced from the data line. The semiconductor layer may overlap the conductive layer, may be spaced from the conductive layer, and may include a source electrode and a drain electrode. The source electrode may be electrically connected to the data line. The gate electrode may overlap the semiconductor layer. The pixel electrode may be electrically connected to the drain electrode.

The active layer may be positioned between the conductive layer and the pixel electrode. The conductive layer may be electrically connected to the pixel electrode.

A first portion of the pixel electrode may directly contact the conductive layer. A second portion of the pixel electrode may directly contact the drain electrode and may be positioned between the gate electrode and the first portion of the pixel electrode.

The second portion of the pixel electrode may be shorter than the first portion of the pixel electrode in a direction perpendicular to (e.g., the face of) the base substrate.

The transistor substrate may include an insulating layer and a bridge. The insulating layer may directly contact the pixel electrode. The bridge may directly contact the insulating layer and may be spaced from the pixel electrode. A first portion of the bridge may directly contact the data line. A second portion of the bridge may directly contact the source electrode and may be positioned between the gate electrode and the first portion of the bridge.

The second portion of the bridge may be shorter than the first portion of the bridge in a direction perpendicular to (e.g., the face of) the base substrate.

The insulating layer may be formed of an organic material.

The transistor substrate may include an insulator. A portion of the insulating layer may be positioned between the first portion of the bridge and a face of the insulator and may directly contact the face of the insulator.

A portion of the pixel electrode may directly contact the conductive layer and may be as long as the first portion of the bridge in a direction perpendicular to (e.g., the face of) the base substrate.

The pixel electrode may include Ni in a range of 3 to 10 parts by mass and La in a range of 1 to 7 parts by mass with respect to Al of 100 parts by mass.

A minimum thickness of the pixel electrode may be in a range of 200 Å to 1,000 Å.

The transistor substrate may include an insulator. The insulator may directly contact both the data line and the conductive layer. A (flat) face of the insulator may be positioned between two faces of the conductive layer, e.g., positioned to the right of a left face of the conductive layer and to the left of a right face of the conductive layer.

An edge of the pixel electrode may be positioned between the source electrode and the drain electrode, e.g., to the right of the source electrode and to the left of the drain electrode as illustrated in the example of FIG. 1.

The transistor substrate may include an oxide layer directly contacting each of the source electrode, the drain electrode, and the gate electrode.

An edge of the conductive layer may be positioned between the source electrode and the drain electrode, e.g., to the right of the source electrode and to the left of the drain electrode as illustrated in the example of FIG. 1.

An embodiment may be related to a display device. The display device may include the following elements: a pixel electrode; a common electrode overlapping the pixel electrode; a light emitting layer positioned between the pixel electrode and the common electrode; a base substrate; a data line directly contacting the base substrate; a conductive layer directly contacting the base substrate and being spaced from the data line; a semiconductor layer overlapping the conductive layer, being spaced from the conductive layer, and including a source electrode and a drain electrode, wherein the source electrode may be electrically connected to the data line, and wherein the drain electrode may be electrically connected to the pixel electrode; and a gate electrode overlapping the semiconductor layer.

An embodiment may be related to a method for manufacturing a transistor substrate. The method may include the following steps: preparing a base substrate; forming a data line and a conductive layer both directly contacting the base substrate; forming a semiconductor layer having a source electrode and a drain electrode, overlapping the conductive layer, and being spaced from the conductive layer; forming a gate electrode overlapping the semiconductor layer; and forming a pixel electrode electrically connected to the drain electrode.

The method may include the following steps: forming an insulating layer before forming the pixel electrode, wherein the pixel electrode may be formed on the insulating layer and may directly contact the insulating layer; and forming a bridge directly contacting the insulating layer. A first portion of the bridge may directly contact the data line. A second portion of the bridge may directly contact the source electrode and may be positioned between the gate electrode and the first portion of the bridge. A portion of the pixel electrode may directly contact the conductive layer and may be as long as the first portion of the bridge in a direction perpendicular to the base substrate.

A first portion of the pixel electrode may directly contact the conductive layer. A second portion of the pixel electrode may directly contact the drain electrode and may be positioned between the gate electrode and the first portion of the pixel electrode.

An edge of the pixel electrode may be positioned between the source electrode and the drain electrode.

An edge of the conductive layer may be positioned between the source electrode and the drain electrode.

According to embodiments, a display device may display images with satisfactory quality even if a light emitting layer in the display device deteriorates.

According to an embodiment, the number of masks required in the manufacturing processes of a transistor substrate and/or of a display device may be minimized. Advantageously, manufacturing cost for the transistor substrate and/or the display device may be minimized.

BRIEF DESCRIPTION OF THE DRAWINGS

FIG. 2A, FIG. 2B, FIG. 2C, FIG. 2D, FIG. 2E, FIG. 2F, and FIG. 2G are cross-sectional views illustrating structures formed in processes of manufacturing a transistor substrate according to an embodiment.

DETAILED DESCRIPTION

Figure 1:
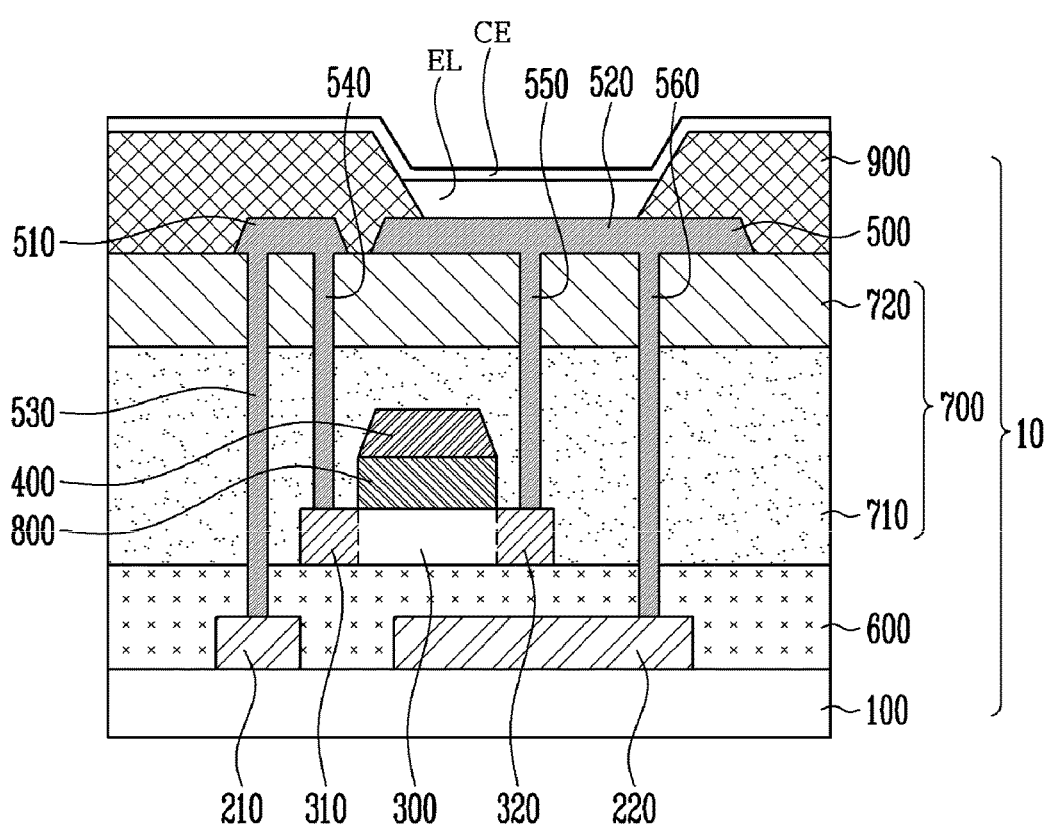
FIG. 1 is a cross-sectional view illustrating a display device including a transistor substrate according to an embodiment.

Example embodiments are described with reference to drawings. Practical embodiments may include all modifications, equivalents, and substitutions.

Like numbers may refer to like elements. In the drawings, dimensions of structures may be exaggerated. While terms such as "first", "second," etc., may be used to describe various elements, the elements should not be limited to these terms. These terms may be used only to distinguish one element from another. For example, a first element may be referred to as a second element without departing from the teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively. The singular forms "a", "an" and "the" may include the plural forms as well, unless the context clearly indicates otherwise.

In the present application, the terms such as "including" or "having," etc., may indicate the existence of the recited features, numbers, operations, actions, elements, parts, or combinations and may not preclude existence of one or more other features, numbers, operations, actions, elements, parts, or combinations. If a first element (such as a layer, a film, an area, or a substrate) is referred to as being "on" a second element, the first element can be directly on the second element, or one or more intervening elements may be present between the first element and the second element. If a first element is referred to as being "directly on" a second element, no intended intervening elements (except environmental elements such as air) may be present between the first element and the second element.

FIG. 1 is a cross-sectional view illustrating a display device including a transistor substrate according to an embodiment. Referring to FIG. 1, the display device includes a transistor substrate 10, a light emitting layer EL, and a common electrode CE. The transistor substrate 10 may include a substrate 100, a data line 210 provided on the substrate 100, a conductive layer 220 provided to be spaced apart from the data line 210, a semiconductor layer 300 provided on the data line 210 and the conductive layer 220 and having a source electrode 310 and a drain electrode 320, a gate electrode 400 provided on the semiconductor layer 300, and a pixel electrode 500 connected to the drain electrode 320.

The transistor substrate 10 may include a first bridge 510, a second bridge 520, a first through hole 530 (or a portion 530 of bridge 510 positioned in a first through hole), a first contact hole 540 (or a portion 540 of bridge 510 positioned in a first contact hole), a second contact hole 550 (or a portion 550 of pixel electrode 500 positioned in a second contact hole), a second through hole 560 (or a portion 560 of pixel electrode 500 positioned in a second through hole), a first insulating layer 600, a passivation layer 710, a hardening layer 720, a gate insulating layer 800, and a third insulating layer 900.

The transistor substrate 10 may be applied to an OLED panel. The transistor substrate 10 may be applied to one or more of other various panels, such as one or more of a twisted nematic (TN) panel, an in-plane switching (IPS) panel, a multi-domain vertical alignment (MVA) panel, and a patterned vertical alignment (PVA) panel.

The transistor substrate 10 may independently/individually control pixels in the display device. For example, transistors of the transistor substrate 10 may be used for independently/individually controlling pixels that emit red, blue, and green light components. The pixels may emit cyan, magenta, yellow, and white light components.

A substrate 100 (or base substrate 100) is provided/included in the transistor substrate 10. A material and a thickness of the substrate 100 may be determined according a particular embodiment. The substrate 100 may be formed of an insulating material, for example, synthetic quartz, calcium fluoride, F-doped quartz, sodalime glass, non-alkali glass, or high molecular resin. The substrate 100 may be formed of a flexible material. The substrate 100 may have a single layer structure or a multilayer structure.

For example, the substrate 100 may include at least one among polystyrene, polyvinyl alcohol, polymethyl methacrylate (PMMA), polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 100 may be formed of fiber glass reinforced plastic.

The data line 210 and the conductive layer 220 are provided on the substrate 100. The data line 210 and the conductive layer 220 may directly contact a same face of the substrate 100 and are spaced apart from each other. The data line 210 and the conductive layer 220 may be formed of the same material. For example, the data line 210 and the conductive layer 220 may include at least one among aluminum (Al), copper (Cu), silver (Ag), molybdenum (Mo), chrome (Cr), tungsten (W), titanium (Ti), and an alloy of some of the above metals.

A voltage for transmitting and receiving data is applied to the data line 210 and the data line 210 transmits the applied voltage to the source electrode 310.

The conductive layer 220 overlaps the semiconductor layer 300. According to an embodiment, the conductive layer 220 may not overlap the source electrode 310. The conductive layer 220 may prevent display quality from deteriorating as the light emitting layer EL deteriorates.

The semiconductor layer 300 may be provided on the conductive layer 220. The semiconductor layer 300 may include an oxide semiconductor, an inorganic semiconductor, or an organic semiconductor. The oxide semiconductor is formed of a zinc oxide (ZnO), an indium oxide (InO), an indium-gallium-zinc oxide (In—Ga—Zn—O), or a zinc-tin oxide (Zn—Sn—O) or may be formed of an oxide including at least two elements among Zn, In, Ga, Sn, and Al. The inorganic semiconductor may include amorphous silicon, polysilicon, etc.

The semiconductor layer 300 includes the source electrode 310 and the drain electrode 320. The source electrode 310 and the drain electrode 320 may be formed by doping or plasma processing the semiconductor layer 300. The gate electrode 400 provided on the semiconductor layer 300 may be used as a doping barrier in a process of forming the source electrode 310 and the drain electrode 320. That is, in the semiconductor layer 300, an area covered by the gate electrode 400 is formed is not doped or plasma processed. However, in the semiconductor layer 300, an area not covered by the gate electrode 400 is doped or plasma processed. The doped or plasma processed area of the semiconductor layer 300 functions as the source electrode 310 and the drain electrode 320. In order to form the source electrode 310 and the drain electrode 320, dopant doped on the semiconductor layer 300 may be properly selected by those skilled in the art. For example, the source electrode 310 and the drain electrode 320 may be formed by doping boron (B), sulfide (S), or hydrogen (H) on the semiconductor layer 300.

The gate electrode 400 is provided on the semiconductor layer 300. The gate electrode 400 controls flow of current between the source electrode 310 and the drain electrode 320 through the semiconductor layer 300. The gate electrode 400 may include at least one of Al, Cu, Ag, Mo, Cr, W, Ti, and an alloy of some of the above metals. Those skilled in the art may properly select a material for forming the gate electrode 400. The gate electrode 400 may be formed of, for example, indium tin oxide (ITO), indium zinc oxide (IZO), or a TCO based alloy.

The drain electrode 320 is electrically (and directly) connected to the pixel electrode 500. Therefore, a voltage applied from the source electrode 310 to the drain electrode 320 through a channel in the semiconductor layer 300 may be transmitted to the pixel electrode 500.

The pixel electrode 500 may include an alloy of Al, nickel (Ni), and lanthanum (La) and/or an ITO or TCO based alloy. The pixel electrode 500 may have a multilayer structure in which a layer formed of the alloy (AlNiLa) of Al, Ni, and La and a layer formed of the ITO or TCO based alloy are sequentially laminated. If the pixel electrode 500 is formed of an alloy (AlNiLa) of Al, Ni, and La, various advantages may be obtained. For example, the alloy (AlNiLa) of Al, Ni, and La is cheap and has high electrical conductivity. In general, in order to increase the electrical conductivity of the pixel electrode 500, Ag is used. The alloy (AlNiLa) of Al, Ni, and La has electrical conductivity similar to that of Ag and is much cheaper than Ag. In addition, the alloy (AlNiLa) of Al, Ni, and La has a high interface characteristic. Since other materials such as Ag have low interface characteristics, a three-layer structure ITO/Ag/ITO in which Ag is interposed between ITOs may be used. However, since the alloy (AlNiLa) of Al, Ni, and La has the high interface characteristic, the multilayer structure (AlNiLa/ITO or TCO) may be used. The alloy (AlNiLa) of Al, Ni, and La may not cause an ion migration phenomenon. In an ion migration phenomenon, when metal is used for an electrode, the metal used for the electrode moves from the electrode to another place in the form of ions. The ion migration phenomenon particularly matters when Ag is used for the electrode. Ag in the pixel electrode 500 moves in the form of ions $Ag^+$. The moved $Ag^+$ ions may be attached to the electrode in the form of a branch. The branch formed on the electrode by the $Ag^+$ ions may cause short between the pixel electrode 500 and the other elements.

The alloy (AlNiLa) of Al, Ni, and La in the pixel electrode 500 may include Ni in a range of 3 to 10 parts by mass and La in a range of 1 to 7 parts by mass with respect to Al of 100 parts by mass. The alloy (AlNiLa) of Al, Ni, and La may satisfy the above composition ratio so that the above-described advantages may be obtained.

The first insulating layer 600 may be provided on the data line 210 and the conductive layer 220. The first insulating layer 600 may have portions of at least one through holes 530 and 560 that expose parts of the data line 210 and the conductive layer 220. The first insulating layer 600 may be formed of an oxide such as $Al_2O_3$, $HfO_2$, $ZrO_2$, $TiO_2$, $SiO_2$, $Ga_2O_3$, $Gd_2O_3$, $V_2O_3$, $Cr_2O_3$, MnO, $Li_2O$, MgO, CaO, $Y_2O_3$, or $Ta_2O_5$ or a nitride such as SiON, SiNx, or HfNx. The through holes 530 and 560 in the first insulating layer 600 expose parts of the data line 210 and the conductive layer 220. Diameters or shapes of the through holes 530 and 560 may be configured according to embodiments.

A second insulating layer 700 may be provided on the gate electrode 400. The second insulating layer 700 has portions of the through holes 530 and 560. The through holes 530 and 560 may extend from the first insulating layer 600. The second insulating layer 700 also has contact holes 540 and 550. The contact holes 540 and 550 formed in the second insulating layer 700 expose parts of the semiconductor layer 300, preferably, parts of the source electrode 310 and the drain electrode 320 of the semiconductor layer 300. Diameters and shapes of the contact holes 540 and 550 may be configured according to embodiments.

The second insulating layer 700 may include a passivation layer 710 and a hardening layer 720 sequentially laminated. The passivation layer 710 may be formed of an inorganic material, and the hardening layer 720 may be formed of an organic material. The inorganic material may be an oxide such as $Al_2O_3$, $HfO_2$, $ZrO_2$, $TiO_2$, $SiO_2$, $Ga_2O_3$, $Gd_2O_3$, $V_2O_3$, $Cr_2O_3$, MnO, $Li_2O$, MgO, CaO, $Y_2O_3$, or $Ta_2O_5$ or a nitride such as SiON, SiNx, or HfNx. If the gate electrode 400 includes easily oxidized Cu, the passivation layer 710 is preferably formed of a nitride since oxygen in an oxide may oxidize the gate electrode 400. The organic material may be a general purpose polymer (for example, polymethyl methacrylate (PMMA) or polystyrene (PS)), polymer derivative having a phenol based group, acryl based polymer, imide based polymer, acryl ether based polymer, amide based polymer, fluorine based polymer, p-xylene based polymer, vinyl alcohol based polymer, or a blend of the above polymers.

Referring to FIG. 1, the first insulating layer 600 includes a first portion of the first through hole 530 that exposes the data line 210 and a first portion of the second through hole 560 that exposes the conductive layer 220. The second insulating layer 700 includes a second portion of the first through hole 530, a second portion of the second through hole 560, and the first and second contact holes 540 and 550 that expose the source electrode 310 and the drain electrode 320 of the semiconductor layer 300. Structures and the number of through holes and contact holes may be configured according to embodiments.

Referring to FIG. 1, the transistor substrate 10 may further include the first bridge 510 provided on the second insulating layer 700. The first bridge 510 may electrically connect the data line 210 and the source electrode 310 through the first through hole 530 and the first contact hole 540. The first bridge 510 may be formed in a process of forming the pixel electrode 500. Therefore, the pixel electrode 500 and the first bridge 510 may be formed of the same material. The first bridge 510 should be spaced apart from the pixel electrode 500. A voltage applied to the data line 210 may be transmitted to the source electrode 310 through the first bridge 510.

Referring to FIG. 1, the transistor substrate 10 may further include the second bridge 520 provided on the second insulating layer 700. The second bridge 520 is spaced from the first bridge 510, may electrically connect the pixel electrode 500 and the conductive layer 220 through the second through hole 560, and may electrically connect the pixel electrode 500 and the drain electrode 320 through the second contact hole 560. The second bridge 520 may be formed together with the pixel electrode 500 in the process of forming the pixel electrode 500 and may be included in the pixel electrode 500. The second bridge 520 may transmit the voltage that the drain electrode 320 receives from the source electrode 310 (through a channel in the semiconductor layer 300) to the pixel electrode 500.

Referring to FIG. 1, the transistor substrate 10 may further include a third insulating layer 900 that exposes a part of the pixel electrode 500 on the pixel electrode 500. The third insulating layer 900 may cover the first bridge 510. The material that forms the third insulating layer 300 may be determined according to embodiments.

Referring to FIG. 1, the display device includes a common electrode CE and a light emitting layer EL. The common electrode CE may include a conductive metal such as magnesium (Mg), Al, platinum (Pt), Ag, gold (Au), Cr, W, Mo, Ti, or an alloy of some of the above metals. The common electrode CE may have a small thickness and high transparency. The light emitting layer EL may include an organic material. For example, the light emitting layer EL may include polyfluorene derivative, (poly)paraphenylenevinylene derivative, polyphenylene derivative, polyvinylcarbazole, polythiophene derivative, PEDOT:PSS(poly(3,4-ethylenedioxythiophene):polystyrene sulfonate), polyanilin (PANI), polypyrrole, or a compound obtained by doping perylene based pigment, coumarine based pigment, rhodamine based pigment, rubrene, perylene, 9,10-diphenylanthracene, tetraphenylbutadiene, Nile red, coumarine, or quinacridone on the one or more of above polymer materials.

The conductive layer 220 may prevent display quality from deteriorating as the light emitting layer EL deteriorates. The light emitting layer EL in the display device may deteriorate as the display device is continuously and/or extensively used. When the light emitting layer EL deteriorates, driving of the light emitting layer EL by a voltage applied to the light emitting layer EL may change. When the driving of the light emitting layer EL by the voltage changes, an operating point of a TFT may change since the operating point of the TFT is determined by driving curves of the light emitting layer EL and the TFT in accordance with a voltage change. The conductive layer 220 saturates a drain current in accordance with increase in a drain voltage in relation to the driving of the TFT. Specifically, the drain current has a linear area that increases in accordance with the increase in the drain voltage and a saturation area that is uniform regardless of the increase in the drain voltage. The conductive layer 220 has the saturation area appear from a low drain voltage range. If the drain current is saturated by the conductive layer 220 from the low drain voltage range, the light emitting layer EL deteriorates so that, although the driving of the light emitting layer EL changes by the voltage, a driving current at an operating point (a driving voltage) does not actually change.

If the driving current is uniformly maintained in spite of the deterioration of the light emitting layer EL, the display quality of the display device including a plurality of TFTs may be maintained. When the light emitting layer EL of a pixel deteriorates so that the driving current at the operating point changes, in comparison with a pixel in which an original driving current is maintained, a brightness difference between the two pixels may be generated. The above-described brightness difference may generate spots in an output screen. In embodiments, since the transistor substrate 10 including the conductive layer 220 uniformly maintains the driving current even when the light emitting layer EL deteriorates, original brightness components of pixels may be substantially maintained. Therefore, the conductive layer 220 may prevent conspicuous spots from being generated and may prevent display quality from deteriorating even when the light emitting layer EL deteriorates.

FIGS. 2A through 2G are cross-sectional views illustrating structures formed in processes of manufacturing the transistor substrate 10 according to an embodiment.

Figure 2A:

Referring to FIG. 2A, in order to manufacture the transistor substrate 10, first, a substrate 100 may be provided.

Figure 2B:
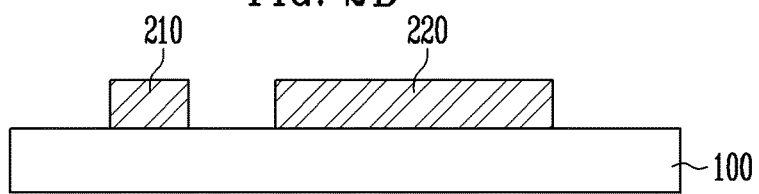

Referring to FIG. 2B, the data line 210 and the conductive layer 220 are formed on the substrate 100. The data line 210 and the conductive layer 220 may be formed by photolithography, that is, by depositing a material and a photosensitive material, forming a first photosensitive mask pattern through exposure and development, performing etching, and stripping the first photosensitive mask pattern. Therefore, the data line 210 and the conductive layer 220 may be simultaneously formed of the same material. The data line 210 and the conductive layer 220 should be spaced apart from each other. The data line 210 and the conductive layer 220 may be easily spaced apart from each other and patterned by selecting the first photosensitive mask pattern in a proper type. Those skilled in the art may select a proper material as the first photosensitive mask pattern. When the data line 210 and the conductive layer 220 are formed, a capacitor lower electrode may be formed together. Since the capacitor lower electrode, the data line 210, and the conductive layer 220 are simultaneously formed, cost associated with an additional process may be prevented.

Referring to FIG. 2C, the first insulating layer 600 and the semiconductor layer 300 are formed on the data line 210 and the conductive layer 220. The first insulating layer 600 may be formed by laminating an oxide such as $Al_2O_3$, $HfO_2$, $ZrO_2$, $TiO_2$, $SiO_2$, $Ga_2O_3$, $Gd_2O_3$, $V_2O_5$, $Cr_2O_3$, $MnO$, $Li_2O$, $MgO$, $CaO$, $Y_2O_3$, or $Ta_2O_5$ and a nitride such as SiON, SiNx, or HfNx. Those skilled in the art may laminate the first insulating layer 600 using a well-known technique.

The semiconductor layer 300 is formed on the first insulating layer 600. The semiconductor layer 300 may be formed by photolithography by depositing a raw material and a photosensitive material, forming a second photosensitive mask pattern, performing etching, and stripping the second photosensitive mask pattern.

Figure 2D:
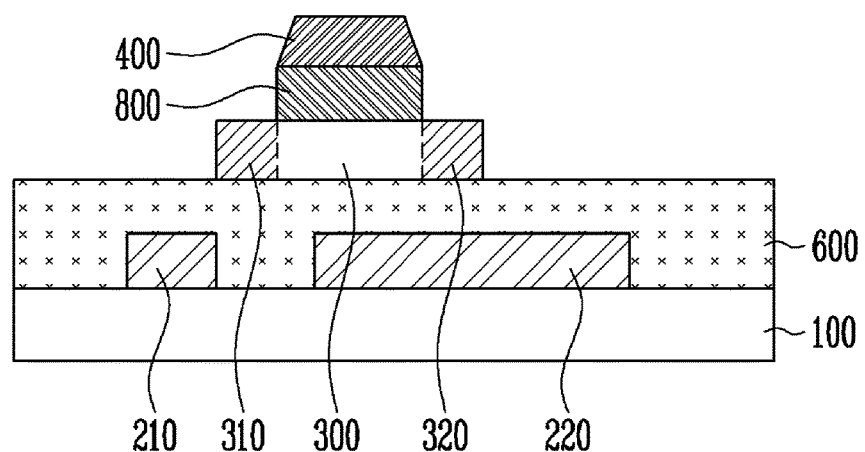

Referring to FIG. 2D, the gate insulating layer 800 and the gate electrode 400 are formed on the semiconductor layer 300. The gate insulating layer 800 and the gate electrode 400 may be formed by photolithography. The gate electrode 400 may function as a mask for patterning the gate insulating layer 800. First, a material of the gate insulating layer 800 is laminated on the semiconductor layer 300. Next, a material of the gate electrode 400 is laminated on the material of the gate insulating layer 800. A photosensitive material is laminated on the laminated gate electrode 400 and a third photosensitive mask pattern is formed in accordance with a patterning type. After forming the third photosensitive mask pattern, the gate electrode 400 is formed by etching the material of the gate electrode 400. After forming the gate electrode 400, the gate insulating layer 800 is formed by etching the material of the gate insulating layer 800. The third photosensitive mask pattern on the gate electrode 400 and the gate electrode 400 may function as masks for patterning the gate insulating layer 800. In the processes of forming the gate electrode 400 and the gate insulating layer 800, a capacitor upper electrode and a capacitor insulating layer may be formed, and cost associated with an additional process may be prevented.

After forming the gate electrode 400, the semiconductor layer 300 may be doped or plasma processed using the gate electrode 400 as a doping barrier. Doped or plasma processed areas in the semiconductor layer 300 become the source electrode 310 and the drain electrode 320.

Figure 2E:
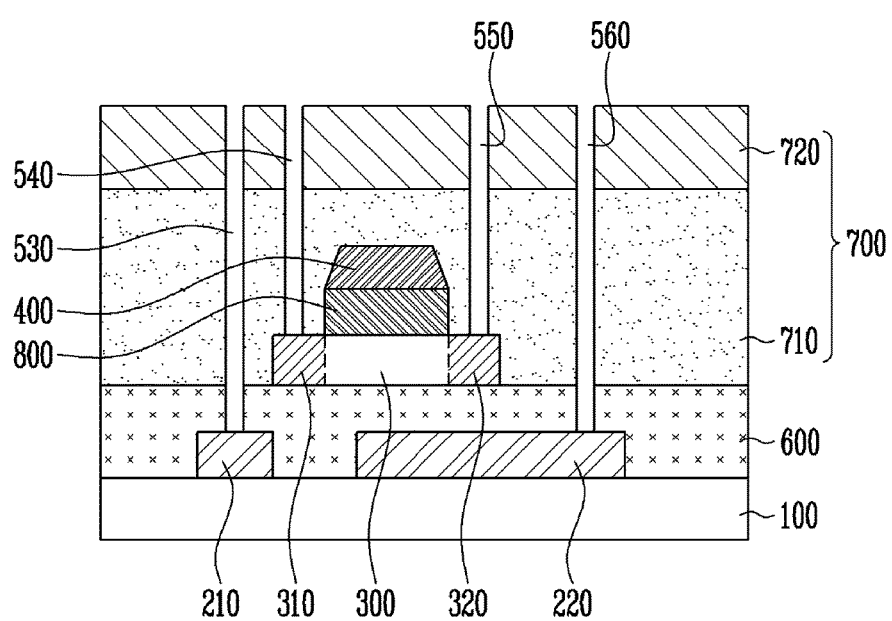

Referring to FIG. 2E, the second insulating layer 700 is formed on the semiconductor layer 300 and the gate electrode 400. In the second insulating layer 700, the passivation layer 710 and the hardening layer 720 are laminated. The second insulating layer 700 of FIG. 2E may include a portion of the first through hole 530, a portion of the second through hole 560, and the first and second contact holes 540 and 550 that respectively expose the source electrode 310 and the drain electrode 320 of the semiconductor layer 300. The first through hole 530, the second through hole 560, the first contact hole 540, and the second contact hole 550 may be formed by photolithography. Specifically, referring to FIG. 2E, the passivation layer 710 is laminated on the semiconductor layer 300 and the gate electrode 400. The hardening layer 720 is formed on the laminated passivation layer 710 and functions as a fourth photosensitive mask pattern for forming the first and second through holes 530 and 560 and the first and second contact holes 540 and 550. Therefore, the hardening layer 720 is formed including portions of the first and second through holes 530 and 560 and including portions of the first and second contact holes 540 and 550. After forming the hardening layer 720, the passivation layer 710 and the first insulating layer 600 under the hardening layer 720 are etched. In order to form the first and second through holes 530 and 560, both the passivation layer 710 and the first insulating layer 600 should be etched. In order to form the first and second contact holes 540 and 550, only the passivation layer 710 is to be etched. The passivation layer 710 and the first insulating layer 600 may be etched by a dry etching method. A surface of the hardening layer 720 may become rough due to the dry etching (surface roughness occurs).

Figure 2F:
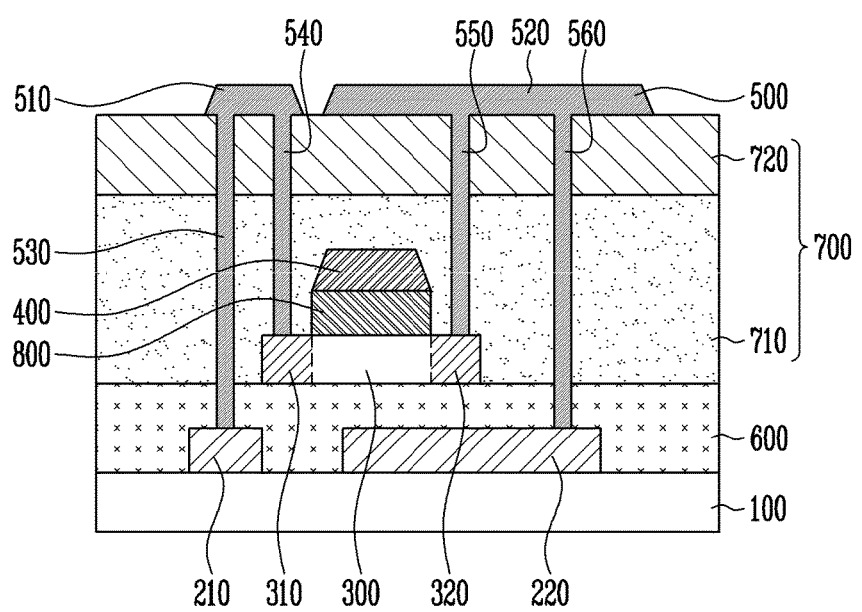

Referring to FIG. 2F, the first bridge 510, the second bridge 520, and the pixel electrode 500 are formed on the hardening layer 720, in the first through hole 530, in the second through hole 560, in the first contact hole 540, and in the second contact hole 550. The pixel electrode 500 may include the second bridge 520. The first bridge 510 and the pixel electrode 500 may be formed by photolithography. Specifically, the first bridge 510 and the pixel electrode 500 may be formed by laminating a material of the first bridge 510 and the pixel electrode 500 on the hardening layer 720, forming a fifth photosensitive mask pattern on the laminated material of the first bridge 510 and the pixel electrode 500, performing etching, and stripping the fifth photosensitive mask pattern. The first bridge 510 and the pixel electrode 500 should be spaced from each other. The first bridge 510 and the pixel electrode 500 may be properly spaced from each other by using a proper fifth photosensitive mask pattern.

The material of the pixel electrode 500 and the first bridge 510 may be an alloy (AlNiLa) of Al, Ni, and La. The alloy (AlNiLa) may have a thickness in a range of about 200 Å through 1,000 Å. If the thickness of the alloy (AlNiLa) is smaller than about 200 Å, the roughness of the surface of the hardening layer 720 that occurs in the processes of forming the through holes 530 and 560 and the contact holes 540 and 550 may affect the pixel electrode 500 and the first bridge 510. If the thickness of the pixel electrode 500 is larger than about 1,000 Å, the transistor substrate 10 may become too thick to be included in a display device.

Referring to FIG. 2G the third insulating layer 900 is provided on the pixel electrode 500. The third insulating layer 900 may cover the first bridge 510 and may expose a part of the pixel electrode 500. A sixth photosensitive mask pattern may be used for forming the third insulating layer 900.

As described above, referring to FIGS. 2A through 2G the transistor substrate 10 may be formed using six masks. In contrast, a conventional method for forming a transistor substrate may require eight masks. Embodiments of manufacturing the transistor substrate 10 have advantages of minimizing the number of masks and/or minimizing manufacturing cost.

Figure 3:
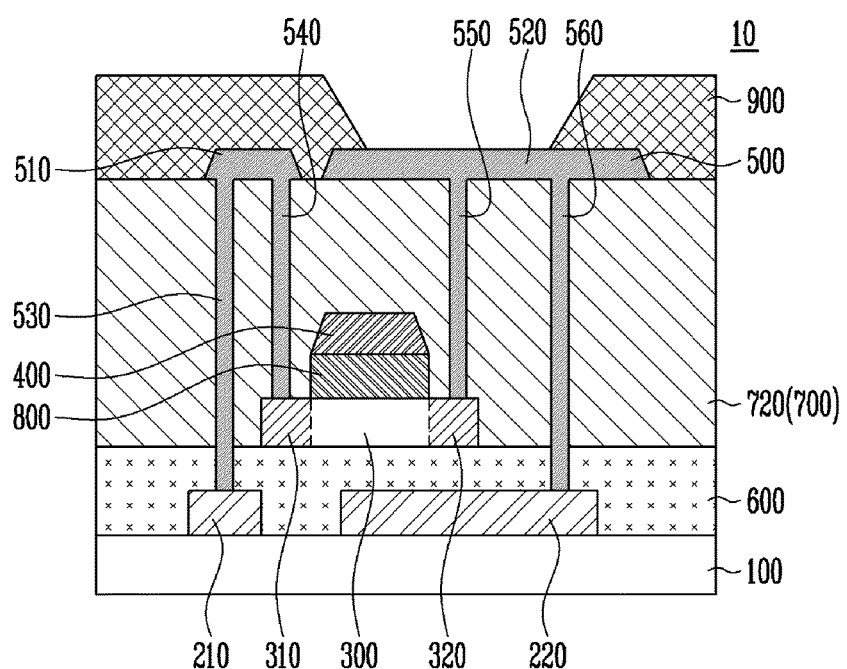
FIG. 3 is a cross-sectional view illustrating a transistor substrate according to an embodiment.

FIG. 3 is a cross-sectional view illustrating a transistor substrate according to an embodiment. Referring to FIG. 3, the second insulating layer 700 may include a hardening layer 720 without requiring a passivation layer 710. Therefore, no passivation layer 710 needs be etched in the processes of forming the first and second through holes 530 and 560 and the first and second contact holes 540 and 550. Therefore, the first and second through holes 530 and 560 are formed by etching the first insulating layer 600 after forming the hardening layer 720 and the first and second contact holes 540 and 550 may be formed by patterning a material layer used for forming the hardening layer 720. In an embodiment, since no process of etching a passivation layer 710 is performed, roughness of the surface of the hardening layer 720 may be minimized.

Figure 4:
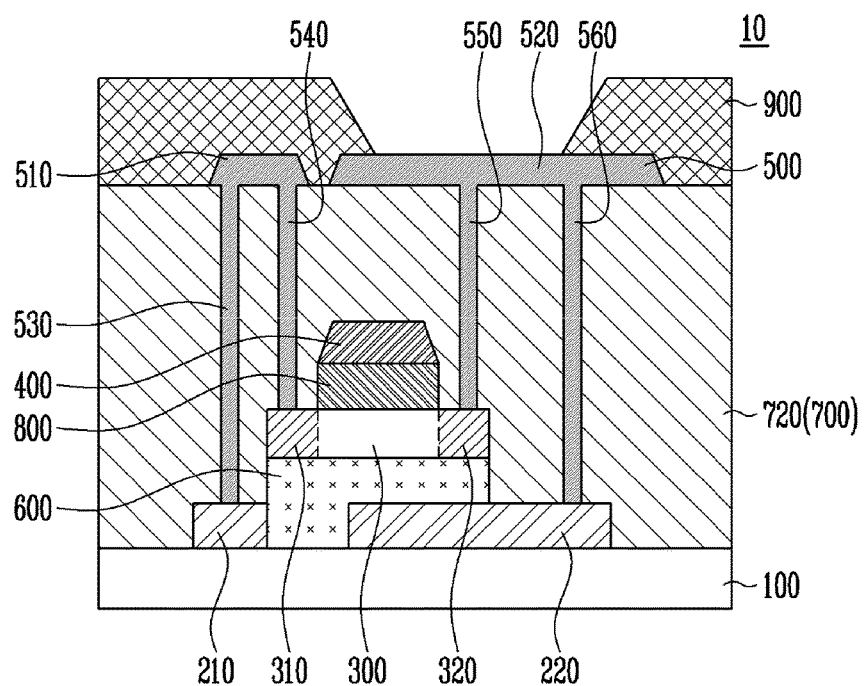
FIG. 4 is a cross-sectional view illustrating a transistor substrate according to an embodiment.

FIG. 4 is a cross-sectional view illustrating a transistor substrate according to an embodiment. Referring to FIG. 4, the semiconductor layer 300 may be formed by photolithography and the first insulating layer 600 may be etched in the process of forming the semiconductor layer 300. As a result, the first insulating layer 600 may be substantially as wide as the semiconductor layer 300. In this case, since the first insulating layer 600 needs not be etched when the first through hole 530 and the second through hole 560 are formed, time spent on the etching process may be saved. In an embodiment, as illustrated in FIG. 4, the second insulating layer 700 may include only the hardening layer 720 formed of the organic material, the etching process for forming the through holes 530 and 560 and the contact holes 540 and 550 may be simplified. In an embodiment, roughness of the surface of the hardening layer 720 may be minimized.

Figure 5:
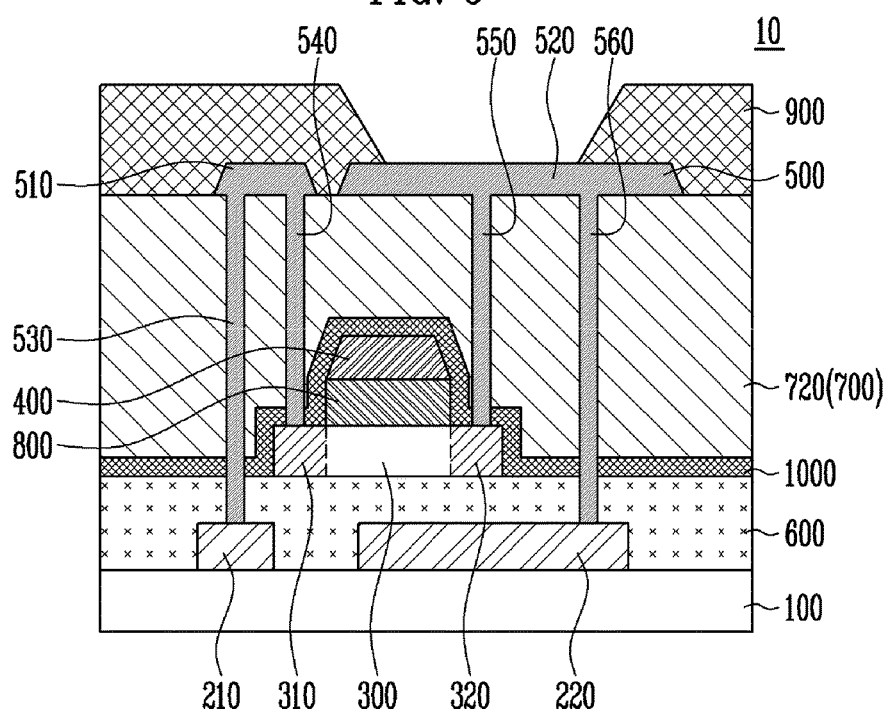
FIG. 5 is a cross-sectional view illustrating a transistor substrate according to an embodiment.

FIG. 5 is a cross-sectional view illustrating a transistor substrate according to an embodiment. Referring to FIG. 5, a blocking layer 1000 may be further provided on the first insulating layer 600, the semiconductor layer 300, and the gate electrode 400. The blocking layer 1000 may include an Al oxide (AlOx). The blocking layer 1000 may be formed by, for example, deposition. The blocking layer 1000 may prevent hydrogen or moisture from permeating into the semiconductor layer 300.

A display device according to an embodiment may be included in various electronic devices, for example, a television set, a laptop computer, a mobile telephone, a smart phone, a smart pad, a portable multimedia player (PMP), a personal digital assistant (PDA), a navigator, and various wearable devices such as a smart watch.

Example embodiments have been disclosed. Various changes to the disclosed embodiments may be made without departing from the spirit and scope of the following claims.

What is claimed is:

1. A transistor substrate comprising:
   a base substrate;
   a data line directly contacting the base substrate;
   a conductive layer directly contacting the base substrate and being spaced from the data line;
   a semiconductor layer overlapping the conductive layer, being spaced from the conductive layer, and comprising a source electrode and a drain electrode, wherein the source electrode is electrically connected to the data line;
a gate electrode overlapping the semiconductor layer; and
a pixel electrode electrically connected to the drain electrode.

2. The transistor substrate of claim 1, wherein the active layer is positioned between the conductive layer and the pixel electrode, and wherein the conductive layer is electrically connected to the pixel electrode.

3. The transistor substrate of claim 1,
wherein a first portion of the pixel electrode directly contacts the conductive layer, and
wherein a second portion of the pixel electrode directly contacts the drain electrode and is positioned between the gate electrode and the first portion of the pixel electrode.

4. The transistor substrate of claim 3, wherein the second portion of the pixel electrode is shorter than the first portion of the pixel electrode in a direction perpendicular to the base substrate.

5. The transistor substrate of claim 1, further comprising:
an insulating layer directly contacting the pixel electrode; and
a bridge directly contacting the insulating layer and being spaced from the pixel electrode,
wherein a first portion of the bridge directly contacts the data line, and
wherein a second portion of the bridge directly contacts the source electrode and is positioned between the gate electrode and the first portion of the bridge.

6. The transistor substrate of claim 5, wherein the second portion of the bridge is shorter than the first portion of the bridge in a direction perpendicular to the base substrate.

7. The transistor substrate of claim 5, further comprising:
an insulator,
wherein a portion of the insulating layer is positioned between the first portion of the bridge and a face of the insulator and directly contacts the face of the insulator.

8. The transistor substrate of claim 5, wherein a portion of the pixel electrode directly contacts the conductive layer and is as long as the first portion of the bridge in a direction perpendicular to the base substrate.

9. The transistor substrate of claim 1, wherein the pixel electrode comprises Ni in a range of 3 to 10 parts by mass and La in a range of 1 to 7 parts by mass with respect to Al of 100 parts by mass.

10. The transistor substrate of claim 1, further comprising:
an insulator directly contacting both the data line and the conductive layer,
wherein a face of the insulator is positioned between two faces of the conductive layer.

11. The transistor substrate of claim 1, wherein an edge of the pixel electrode is positioned between the source electrode and the drain electrode.

12. The transistor substrate of claim 1, further comprising an oxide layer directly contacting each of the source electrode, the drain electrode, and the gate electrode.

13. The transistor substrate of claim 1, wherein an edge of the conductive layer is positioned between the source electrode and the drain electrode.

14. A display device comprising:
a pixel electrode;
a common electrode overlapping the pixel electrode;
a light emitting layer positioned between the pixel electrode and the common electrode;
a base substrate;
a data line directly contacting the base substrate;
a conductive layer directly contacting the base substrate and being spaced from the data line; a semiconductor layer overlapping the conductive layer, being spaced from the conductive layer, and comprising a source electrode and a drain electrode, wherein the source electrode is electrically connected to the data line, and wherein the drain electrode is electrically connected to the pixel electrode; and
a gate electrode overlapping the semiconductor layer.

15. A method of manufacturing a transistor substrate, the method comprising:
preparing a base substrate;
forming a data line and a conductive layer both directly contacting the base substrate;
forming a semiconductor layer comprising a source electrode and a drain electrode, overlapping the conductive layer, and being spaced from the conductive layer;
forming a gate electrode overlapping the semiconductor layer; and
forming a pixel electrode electrically connected to the drain electrode.

16. The method of claim 15, further comprising:
forming an insulating layer before forming the pixel electrode, wherein the pixel electrode is formed on the insulating layer and directly contacts the insulating layer; and
forming a bridge directly contacting the insulating layer, wherein a first portion of the bridge directly contacts the data line, and wherein a second portion of the bridge directly contacts the source electrode and is positioned between the gate electrode and the first portion of the bridge.

17. The method of claim 16,
wherein a portion of the pixel electrode directly contacts the conductive layer and is as long as the first portion of the bridge in a direction perpendicular to the base substrate.

18. The method of claim 15,
wherein a first portion of the pixel electrode directly contacts the conductive layer, and
wherein a second portion of the pixel electrode directly contacts the drain electrode and is positioned between the gate electrode and the first portion of the pixel electrode.

19. The method of claim 15, wherein an edge of the pixel electrode is positioned between the source electrode and the drain electrode.

20. The method of claim 15, wherein an edge of the conductive layer is positioned between the source electrode and the drain electrode.

* * * * *